United States Patent
Kumazaki

(10) Patent No.: US 8,037,436 B2
(45) Date of Patent: Oct. 11, 2011

(54) CIRCUIT VERIFICATION APPARATUS, A METHOD OF CIRCUIT VERIFICATION AND CIRCUIT VERIFICATION PROGRAM

(75) Inventor: Masahito Kumazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 291 days.

(21) Appl. No.: 12/397,018

(22) Filed: Mar. 3, 2009

(65) Prior Publication Data

US 2009/0228848 A1 Sep. 10, 2009

(30) Foreign Application Priority Data

Mar. 4, 2008 (JP) ................................. 2008-053589
Feb. 16, 2009 (JP) ................................. 2009-032247

(51) Int. Cl.
*G06F 9/455* (2006.01)
*G06F 17/50* (2006.01)

(52) U.S. Cl. ........ 716/111; 716/106; 716/110; 716/126; 716/136; 716/137

(58) Field of Classification Search .................. 716/106, 716/107, 111–113, 110, 126, 136, 137
See application file for complete search history.

(56) References Cited

U.S. PATENT DOCUMENTS

| | | | | |
|---|---|---|---|---|
| 7,657,853 | B2 * | 2/2010 | Sato et al. | 716/106 |
| 2003/0046644 | A1 * | 3/2003 | Wheeler et al. | 716/5 |
| 2007/0180422 | A1 * | 8/2007 | Cromity et al. | 716/13 |
| 2008/0092089 | A1 * | 4/2008 | Kobayashi | 716/1 |
| 2008/0244484 | A1 * | 10/2008 | Kumazaki | 716/5 |
| 2008/0301600 | A1 * | 12/2008 | Kumagai | 716/5 |
| 2009/0055784 | A1 * | 2/2009 | Izumi et al. | 716/5 |
| 2009/0293027 | A1 * | 11/2009 | Yamazaki et al. | 716/5 |

FOREIGN PATENT DOCUMENTS

| | | |
|---|---|---|
| JP | 1991028971 A | 2/1991 |
| JP | 1994120345 A | 4/1994 |
| JP | 1997-167170 A | 6/1997 |
| JP | 1997-237289 A | 9/1997 |
| JP | 1998-254938 A | 9/1998 |
| JP | 11-102379 A | 4/1999 |
| JP | 2001325315 A | 11/2001 |
| JP | 2004280279 A | 10/2004 |
| JP | 2005196681 A | 7/2005 |
| JP | 2007094506 A | 4/2007 |
| JP | 2008009574 A | 1/2008 |

OTHER PUBLICATIONS

Japanese Office Action for JP2009-032247 issued Mar. 23, 2010.

* cited by examiner

*Primary Examiner* — Paul Dinh
*Assistant Examiner* — Nha Nguyen

(57) ABSTRACT

A circuit verification apparatus for verifying justice of wiring connections of PWB is provided. The circuit verification apparatus includes a net list reduction part for generating a reduction net list in which unnecessary components and connections for verification are eliminated from connection relationships for all components used in the PWB; a connection rule for defining conditions of a pair of start point and end point of each expected connection by using variables and function; a rule expanding part for developing the connection rule by using conditions of a pin specified to the start point, determining end point conditions corresponding to the start point and generating a post-development rule including developed conditions of the start point and end point; and a net list and rule matching verification part for verifying matching state of each connection with referring to the reduction net list and the post-development rule, and outputs a verification result.

18 Claims, 12 Drawing Sheets

Fig.7

| RULE NAME | START POINT COMPONENT NAME | START POINT LOCATION NAME | START POINT PIN NAME | FIRST END POINT COMPONENT NAME | FIRST END POINT LOCATION NAME | FIRST END POINT PIN NAME | SECOND END POINT COMPONENT NAME | SECOND END POINT LOCATION NAME | SECOND END POINT PIN NAME |
|---|---|---|---|---|---|---|---|---|---|
| FIRST RULE | THIRD TYPE LSI | C_x1 | CL_x2 | SECOND TYPE LSI | M_f(x1) | CL_f(x2) | | | |
| SECOND RULE | ALL COMPONENTS | C_x1 | D[_x2_] | ALL TYPE LSI | D_g(x1,0) | D[_f(x2)_] | ALL TYPE LSI | D_g(x1,1) | D[_f(x2)_] |
| FUNCTION | f(x)=x<br>g(x, y)=2x+y | | | | | | | | |

Fig.11

| RULE NAME | START POINT COMPONENT NAME | START POINT LOCATION NAME | START POINT PIN NAME | FIRST END POINT COMPONENT NAME | FIRST END POINT LOCATION NAME | FIRST END POINT PIN NAME | SECOND END POINT COMPONENT NAME | SECOND END POINT LOCATION NAME | SECOND END POINT PIN NAME |
|---|---|---|---|---|---|---|---|---|---|
| FIRST RULE | THIRD TYPE LSI | C0 | CLP | SECOND TYPE LSI | M0 | CLP | | | |
| FIRST RULE | THIRD TYPE LSI | C0 | CLN | SECOND TYPE LSI | M0 | CLN | | | |
| FIRST RULE | THIRD TYPE LSI | C1 | CLP | SECOND TYPE LSI | M1 | CLP | | | |
| FIRST RULE | THIRD TYPE LSI | C1 | CLN | SECOND TYPE LSI | M1 | CLN | | | |
| SECOND RULE | ALL COMPONENTS | C0 | D[0] | ALL TYPE LSI | D0 | D[0] | ALL TYPE LSI | D1 | D[0] |
| SECOND RULE | ALL COMPONENTS | C0 | D[1] | ALL TYPE LSI | D0 | D[1] | ALL TYPE LSI | D1 | D[1] |
| SECOND RULE | ALL COMPONENTS | C0 | D[2] | ALL TYPE LSI | D0 | D[2] | ALL TYPE LSI | D1 | D[2] |
| SECOND RULE | ALL COMPONENTS | C0 | D[3] | ALL TYPE LSI | D0 | D[3] | ALL TYPE LSI | D1 | D[3] |
| SECOND RULE | ALL COMPONENTS | C0 | D[4] | ALL TYPE LSI | D0 | D[4] | ALL TYPE LSI | D1 | D[4] |
| SECOND RULE | ALL COMPONENTS | C0 | D[5] | ALL TYPE LSI | D0 | D[5] | ALL TYPE LSI | D1 | D[5] |
| SECOND RULE | ALL COMPONENTS | C0 | D[6] | ALL TYPE LSI | D0 | D[6] | ALL TYPE LSI | D1 | D[6] |
| SECOND RULE | ALL COMPONENTS | C0 | D[7] | ALL TYPE LSI | D0 | D[7] | ALL TYPE LSI | D1 | D[7] |
| SECOND RULE | ALL COMPONENTS | C0 | D[8] | ALL TYPE LSI | D0 | D[8] | ALL TYPE LSI | D1 | D[8] |
| SECOND RULE | ALL COMPONENTS | C0 | D[9] | ALL TYPE LSI | D0 | D[9] | ALL TYPE LSI | D1 | D[9] |
| SECOND RULE | ALL COMPONENTS | C1 | D[0] | ALL TYPE LSI | D2 | D[0] | ALL TYPE LSI | D3 | D[0] |
| SECOND RULE | ALL COMPONENTS | C1 | D[1] | ALL TYPE LSI | D2 | D[1] | ALL TYPE LSI | D3 | D[1] |
| SECOND RULE | ALL COMPONENTS | C1 | D[2] | ALL TYPE LSI | D2 | D[2] | ALL TYPE LSI | D3 | D[2] |
| SECOND RULE | ALL COMPONENTS | C1 | D[3] | ALL TYPE LSI | D2 | D[3] | ALL TYPE LSI | D3 | D[3] |
| SECOND RULE | ALL COMPONENTS | C1 | D[4] | ALL TYPE LSI | D2 | D[4] | ALL TYPE LSI | D3 | D[4] |
| SECOND RULE | ALL COMPONENTS | C1 | D[5] | ALL TYPE LSI | D2 | D[5] | ALL TYPE LSI | D3 | D[5] |
| SECOND RULE | ALL COMPONENTS | C1 | D[6] | ALL TYPE LSI | D2 | D[6] | ALL TYPE LSI | D3 | D[6] |
| SECOND RULE | ALL COMPONENTS | C1 | D[7] | ALL TYPE LSI | D2 | D[7] | ALL TYPE LSI | D3 | D[7] |
| SECOND RULE | ALL COMPONENTS | C1 | D[8] | ALL TYPE LSI | D2 | D[8] | ALL TYPE LSI | D3 | D[8] |
| SECOND RULE | ALL COMPONENTS | C1 | D[9] | ALL TYPE LSI | D2 | D[9] | ALL TYPE LSI | D3 | D[9] |

Fig.12

| RULE NAME | START POINT COMPONENT NAME | START POINT LOCATION NAME | START POINT PIN NAME | VERIFICATION RESULT |
|---|---|---|---|---|
| FIRST RULE | THIRD TYPE LSI | C0 | CLP | AGREED |
| FIRST RULE | THIRD TYPE LSI | C0 | CLN | AGREED |
| FIRST RULE | THIRD TYPE LSI | C1 | CLP | AGREED |
| FIRST RULE | THIRD TYPE LSI | C1 | CLN | AGREED |
| SECOND RULE | THIRD TYPE LSI | C0 | D[0] | AGREED |
| SECOND RULE | THIRD TYPE LSI | C0 | D[1] | AGREED |
| SECOND RULE | THIRD TYPE LSI | C0 | D[2] | AGREED |
| SECOND RULE | THIRD TYPE LSI | C0 | D[3] | AGREED |
| SECOND RULE | THIRD TYPE LSI | C0 | D[4] | AGREED |
| SECOND RULE | THIRD TYPE LSI | C0 | D[5] | AGREED |
| SECOND RULE | THIRD TYPE LSI | C0 | D[6] | AGREED |
| SECOND RULE | THIRD TYPE LSI | C0 | D[7] | AGREED |
| SECOND RULE | THIRD TYPE LSI | C0 | D[8] | AGREED |
| SECOND RULE | THIRD TYPE LSI | C0 | D[9] | AGREED |
| SECOND RULE | THIRD TYPE LSI | C1 | D[0] | AGREED |
| SECOND RULE | THIRD TYPE LSI | C1 | D[1] | AGREED |
| SECOND RULE | THIRD TYPE LSI | C1 | D[2] | AGREED |
| SECOND RULE | THIRD TYPE LSI | C1 | D[3] | AGREED |
| SECOND RULE | THIRD TYPE LSI | C1 | D[4] | AGREED |
| SECOND RULE | THIRD TYPE LSI | C1 | D[5] | AGREED |
| SECOND RULE | THIRD TYPE LSI | C1 | D[6] | AGREED |
| SECOND RULE | THIRD TYPE LSI | C1 | D[7] | AGREED |
| SECOND RULE | THIRD TYPE LSI | C1 | D[8] | AGREED |
| SECOND RULE | THIRD TYPE LSI | C1 | D[9] | AGREED |

US 8,037,436 B2

CIRCUIT VERIFICATION APPARATUS, A METHOD OF CIRCUIT VERIFICATION AND CIRCUIT VERIFICATION PROGRAM

This application is based upon and claims the benefit of priority from Japanese patent application No. 2008-053589, filed on Mar. 4, 2008 and No. 2009-032247, filed on Feb. 16, 2009, the disclosure of which are incorporated herein in their entirety by reference.

TECHNICAL FIELD

The present invention relates to a circuit verification apparatus, a method of circuit verification and circuit verification program, and particularly relates to a circuit verification apparatus, a method of circuit verification and circuit verification program used for verifying wiring connections designed for a Printed Wiring Board.

BACKGROUND ART

In accordance with progress of semiconductor technology, an electronic circuit board mounting a large number of LSIs (Large Scale Integrated circuit) on a printed wiring board (PWB) is widely used. Among such LSIs mounted on the PWB, the LSI having a large number of pins on it is also increasing.

In a design and development work of PWB, it needs to verify whether the design of wiring for the LSI mounted on the PWB are logically correct and whether wiring connections are correctly connected to proper points. In order to perform this kind of verification, it needs enormous amount of descriptive rules for defining each wiring connection on the PWB (hereinafter this rule is called as a connection rule). Therefore, big amount of man power is spent for producing the connection rule used in the verification work of each PWB, and long retrieval time among all connection rule for finding necessary connection rule which is suitably used in a respective proper verification work is necessary, and also many resources are needed for storing such enormous amount of connection rule in a verification apparatus.

The following patent documents disclose technologies relating to various verification works which are needed for efficiently performing design and development works of PWB on which plural LSIs are mounted.

Japanese Patent Application Laid-Open No. 1991-028971 discloses technology for a verification method of mask patterns which are required when mask layout data of LSI is created. According to this patent document, this technology can reduce verification processing time by performing verification of a plurality of cell data, which compose the mask layout data, at once in a cell level.

Japanese Patent Application Laid-Open No. 1994-120345 discloses technology relating to a layout verification work for an LSI design. According to this patent document, this technology can exclude a comparison mistake in comparison process of comparing between layout data and circuit data for a repeated structured cell part by using an electronic computer, and it can efficiently performs a design check work.

Japanese Patent Application Laid-Open No. 1997-167170 discloses technology relating to a design work of an electronic circuit having regular and repeated structures like a semiconductor memory and a liquid crystal display panel. According to this patent document, this technology can automatically perform a verification processing which is equivalent to the process in which the whole electronic circuit having regular and repeated structures is processed at once. This technology is characterized by setting regular and repeated structure model which can determine the regularity and individual data as structure definition information.

Japanese Patent Application Laid-Open No. 1997-237289 discloses technology for automatically generating the hardware description which is used for logic verification of an electronic circuit and is generated from a circuit diagram of the electronic circuit. According to this patent document, this technology can automatically generate the hardware description, which represents logic functions of the electronic circuit for the logic verification, from the circuit diagram without changing connection information on the circuit diagram. This technology is characterized in that deletion information for analog components, like resistors, which are shown in the circuit diagram and are not needed for the logic verification, is added, and the deletion information is effectively used for generating the hardware description automatically.

Japanese Patent Application Laid-Open No. 1998-254938 discloses technology for converting a large-scale digital analog mixed circuit into a suitable circuit to be used for high speed and efficient digital simulation. According to this patent document, this technology can efficiently perform model conversion according to conversion rules for the digital analog mixed circuit, and a converted circuit in accordance with the characteristics of the logic simulator to be used is obtained.

SUMMARY

An exemplary object of the present invention is to provide a circuit verification apparatus which can reduce man power required for verifying justice of wiring connections of LSI in the design and development works of the PWB.

The circuit verification apparatus according to an exemplary aspect of the invention includes a net list reduction part which generates a reduction net list in which unnecessary components and unnecessary connections for verification are eliminated from connection relationships for all components used in the PWB with referring to a reduction components library which defines the unnecessary components and unnecessary connections; a connection rule which defines conditions of a pair of start point and end point of each expected connection by using variables and functions; a rule expanding part which develops the connection rule by using specific conditions of a pin which is specified to the start point, determines end point conditions corresponding to the specific conditions of the specified pin at the start point and generates a post-development rule which includes developed conditions of the start point and corresponding end point; and a net list and rule matching verification part which verifies matching state of the start point and corresponding end point for each connection with referring to the reduction net list and the post-development rule, and outputs a verification result.

BRIEF DESCRIPTION OF THE DRAWINGS

Exemplary features and advantages of the present invention will become apparent from the following detailed description when taken with the accompanying drawings in which:

FIG. 7 is a table exemplifying a part of contents of the connection rule 15;

FIG. 11 is a table exemplifying a part of contents of the post-development rule 33 generated by the rule expanding part 23; and FIG. 12 is a table exemplifying a part of contents of the verification result 34.

EXEMPLARY EMBODIMENT

Exemplary embodiments of the present invention will now be described in detail in accordance with the accompanying drawings.

Figure 1:
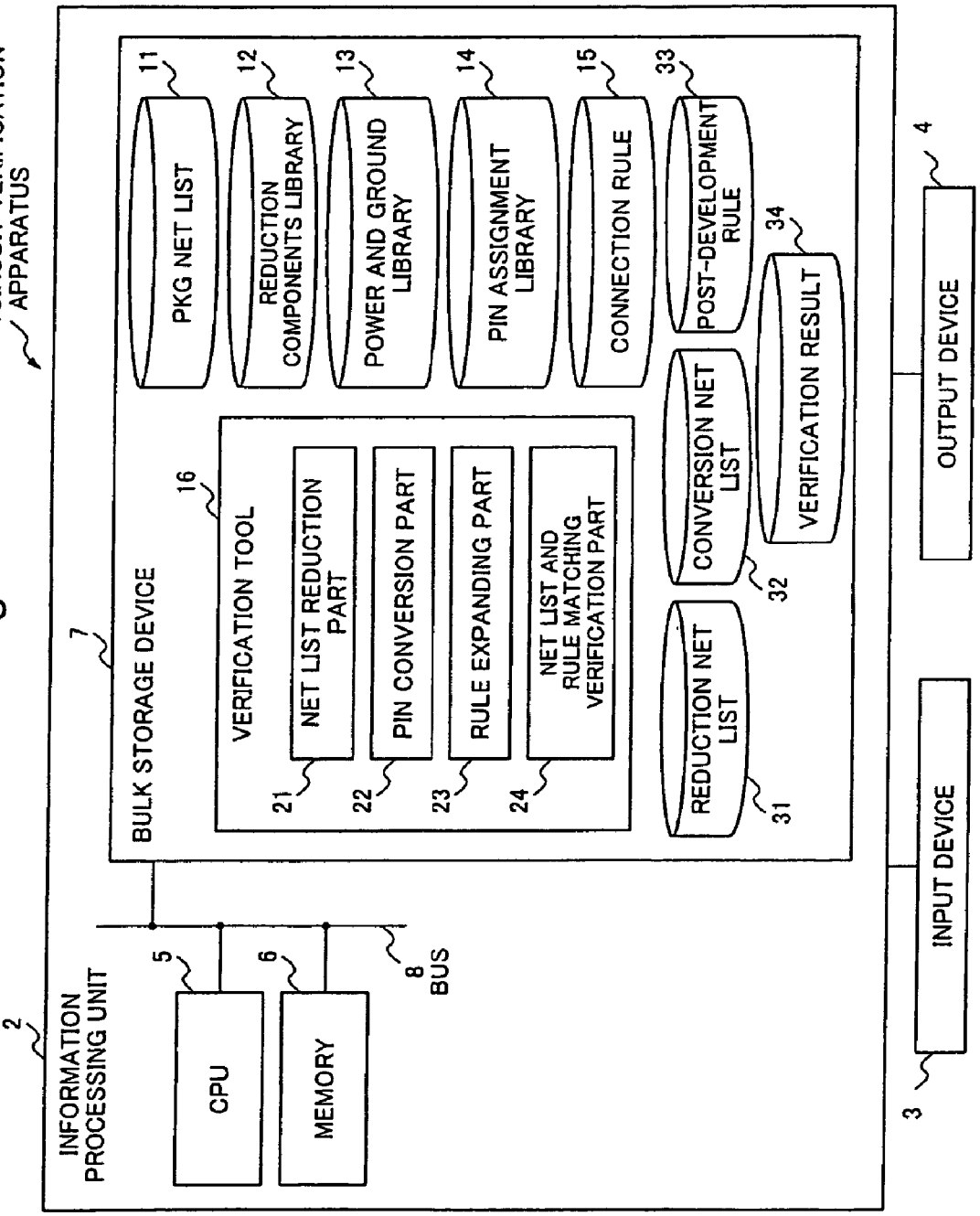
FIG. 1 is a block diagram showing configuration of the circuit verification apparatus 1 according to this exemplary embodiment.

FIG. 1 is a block diagram showing configuration of a circuit verification apparatus 1 according to this exemplary embodiment. The circuit verification apparatus 1 includes an information processing unit 2, an input device 3 and an output device 4. The information processing unit 2 is connected to the input device 3 and the output device 4.

The information processing unit 2 is a unit which operates by following procedures written in a computer program and handles information at high speed. The information processing unit 2 is provided with five basic functions of "input, memorization, calculation, control and output". The input device 3 is a man-machine interface device which inputs data to the information processing unit 2. The output device 4 is a man-machine interface device which outputs processing results of the information processing unit 2 to outside.

Referring to FIG. 1, the information processing unit 2 includes CPU (Central Processing Unit) 5, a memory 6 and a bulk storage device 7, and those elements are connected via a bus 8. The CPU 5 deals with control of various devices and elements included in the information processing unit 2 and data processing. The CPU 5 interprets data received from the input device 3 and data stored in the memory 6 and the bulk storage device 7, calculates and outputs the result by the output device. The memory 6 is a memory device represented by RAM (Random Access Memory) or the like for storing data. The memory 6 is used when the CPU 5 executes data processing. The bulk storage device 7 is a memory storage represented by HDD (Hard Disk Drive) and stores information and data in relation to this exemplary embodiment.

As information and data in relation to this exemplary embodiment, the bulk storage device 7 stores PKG (Package) net list 11, reduction components library 12, power and ground net library 13, pin assignment library 14, connection rule 15, verification tool 16, reduction net list 31, conversion net list 32, post-development rule 33 and verification result 34. Here, the net list is text data which indicates connection relationship of wirings in the circuit.

The PKG net list 11 includes net list relating to all components to be mounted on a PWB of verification object (hereinafter called as a verification target PWB), i.e., it has information on each wiring connection relationship for all components used in the verification target PWB. In other words, the PKG net list 11 includes text data indicating each wiring connection relationship drawn in a circuit diagram corresponding to the verification target PWB.

The reduction components library 12 is a library which defines name of each component of reduction object (hereinafter called as a reduction target component) used in the verification target PWB, and connection relationship of each pin of the reduction target component. With respect to "reduction", it means eliminating unnecessary components and unnecessary connections for verification from the PKG net list, and detail will be explained later.

The power and ground net library 13 is a library which defines a net name which becomes a power and ground net.

The pin assignment library 14 is a library which defines pin names of an original pin name and a post-conversion pin name of each component of conversion object (hereinafter called as a conversion target component) used in the verification target PWB. With respect to "conversion", it means converting pin name, and detail will be explained later.

The connection rule 15 includes each connection rule for defining an expected wiring connection of LSI used in the verification target PWB. The connection rule defines conditions of start point and end point of the wiring connection by employing a simplified form in which functions, equations and variables are used for defining connection conditions and relationship for the start point pin and the end point pin of concerned component.

In most cases, a regular formation is used for each connection of LSI mounted on a PWB. Therefore, in the present invention, connection relationship and regularity of such regular formation are considered in a description of the connection rule. With respect to the start point and the end point, the corresponding expected component name, expected location (or position) name of the component and expected pin name of the component are described as each element of the connection rule. It is possible to use and designate variables for defining the start point conditions. And, it is possible to designate the function that uses the variables designated at the start point conditions as an argument for defining the end point conditions. A plurality of points can be designated as the end points. Wild characters for representing arbitrary characters and a regular expression can also be used as a description of each element of the rule which specifies the start point conditions and the end point conditions. An equation is defined in the function. It is possible to use descriptions which are used in the description of an ordinary software program such as numerical value calculation and a definition of character string operation, and one value (figure or character string) is set as returning values.

Thus, in the present invention, each connection rule can be expressed with the functions and variables. By this arrangement, the amount of description quantity of the connection rule can be reduced substantially.

The reduction net list 31 includes the net list which defines each wiring connection of the circuit diagram after reduction processing has been performed to the connection relating to the reduction target component among all components used in the verification target PWB.

The conversion net list 32 includes the net list which defines each wiring connection of the circuit diagram after conversion processing, which converts a pin name of the conversion target component, has been performed to the connection relating to the conversion target component in the reduction net list 31. The content of this net list has simplified pin names for making description of the connection rule easily.

The post-development rule 33 defines each connection relationship in which the end point conditions have been developed by the connection rule 15 in accordance with the start point conditions. That is, the endpoint conditions are developed by using the functions and variables according to the corresponding connection rule. The start point conditions and the corresponding end point conditions are stored as the post-development rule 33 by using actual names of the component name, location name of the component and pin name of the component.

The verification result 34 includes each matching verification result of matching verification processing, which will be explained later, for each connection rule and its corresponding net list by referring to the conversion net list 32 and the post-development rule 33. When the actual names used at the start point and the end point of a certain connection traced by using the conversion net list 32 agree with the actual names set in the post-development rule 33 for the same connection, it means that correctness of the description of the connection rule is verified, or a net list agrees with the corresponding connection rule.

The verification tool 16 includes several functional parts which perform control operation of the circuit verification according to the exemplary embodiment. They are a net list reduction part 21, a pin conversion part 22, a rule expanding part 23 and a net list and rule matching verification part 24. The net list reduction part 21 is used for generating the reduction net list 31, the pin conversion part 22 is used for generating the conversion net list 32, the rule expanding part 23 is used for generating the post-development rule 33 and the net list and rule matching verification part 24 is used for outputting the verification result 34.

Figure 2:
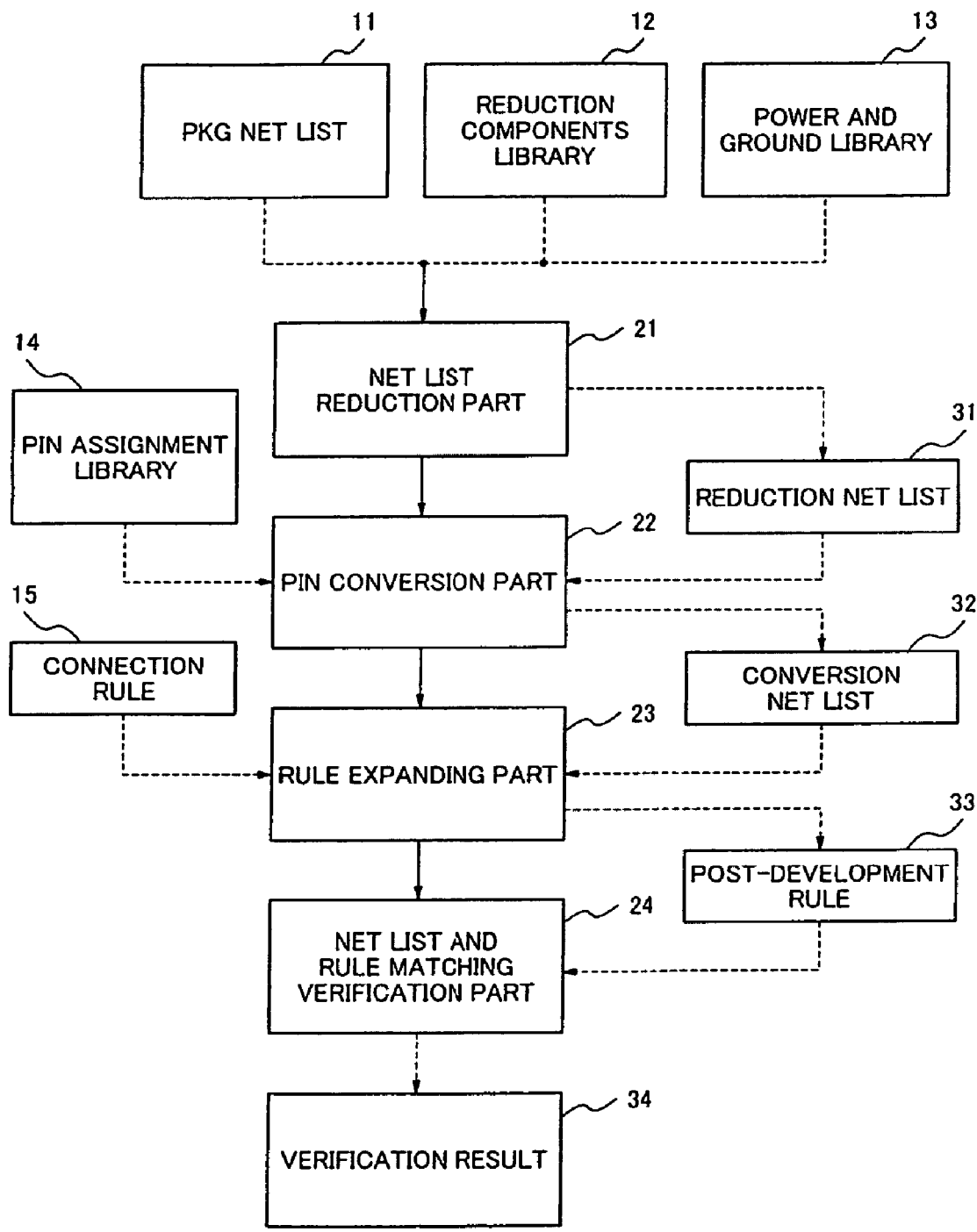
FIG. 2 is a block diagram showing connection relationship among constitutional elements included in the bulk storage device 7 of the circuit verification apparatus 1 and its data flow.

FIG. 2 is a block diagram showing connection relationships among constitutional elements included in the bulk storage device 7 of the circuit verification apparatus 1 and its data flow.

The net list reduction part 21 generates the reduction net list 31 in which electrical factors and physical factors have been excluded from the PKG net list 11 by performing the reduction processing to the reduction target component. The net list reduction part 21 carries out the reduction processing to the reduction target component based on data read from the PKG net list 11, the reduction components library 12 and the power and ground net library 13. The net list reduction part 21 stores the generated reduction net list 31 in a predetermined area of the bulk storage device 7 and the memory 6, and takes over processing to the pin conversion part 22.

The pin conversion part 22 generates the conversion net list 32 by converting each pin name of the conversion target component in the reduction net list 31 based on data read from the pin assignment library 14. The generated conversion net list 32 is stored in the bulk storage device 7 and the memory 6, and processing is taken over to the rule expanding part 23. However, because the pin conversion is performed in order to make it simple for describing and verifying a rule, it is not necessary to perform this pin conversion if there is no problem for describing and verifying the rule by using an original pin name.

The rule expanding part 23 generates the post-development rule 33 based on data read from the connection rule 15 and the conversion net list 32. The rule expanding part 23 generates the post-development rule 33 by developing the end point conditions based on the connection rule with using attribute information of pin specified at the start point. When the attribute information of a certain pin agrees with each condition of the start point pin defined by the connection rule, this pin is specified as the start point. The attribute information includes the component name, location name of the component and pin name of the component, and they are used for determining a value of each variable defined at the start point for developing the end point conditions. The generated post-development rule 33 is stored in a predetermined area of the bulk storage device 7 and the memory 6, and processing is taken over to the net list and rule matching verification part 24.

The net list and rule matching verification part 24 performs verification whether the net list is properly designed based on data read from the post-development rule 33. The net list and rule matching verification part 24 performs matching verification whether conditions relating to the start point pin and the end point pin after development are matching with conditions indicated in the net list by referring to the conversion net list 32 and the post-development rule 33, and generates the verification result 34 as the result.

Figure 3:
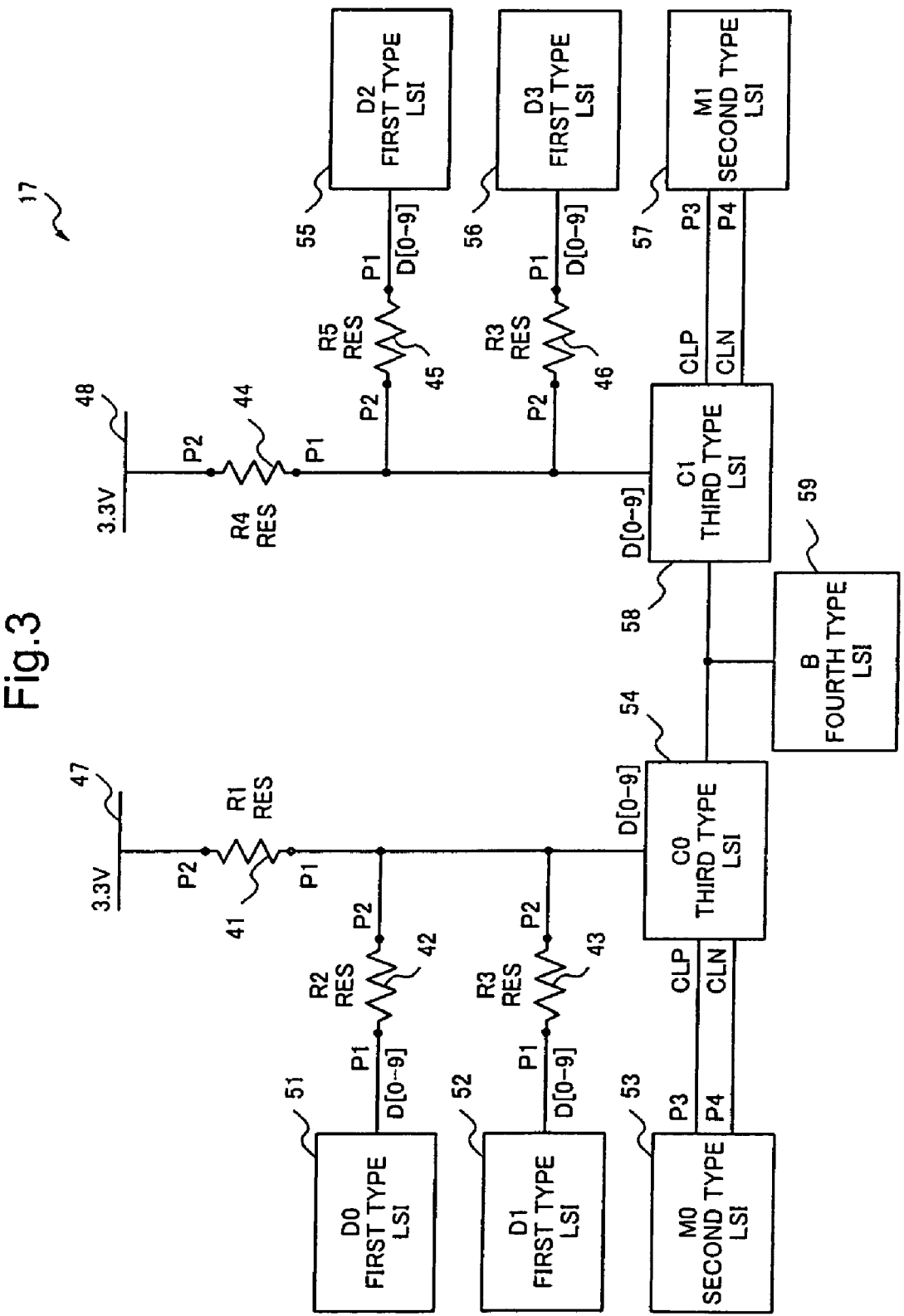
FIG. 3 is a circuit model which illustrates a circuit diagram of verification target in this exemplary embodiment.

FIG. 3 is a circuit model which illustrates a circuit diagram of the verification target PWB in this exemplary embodiment. The circuit model 17 shown in FIG. 3 is generated based on the PKG net list 11. The circuit model 17 includes a plurality of components and nets. Each of the plurality of components includes a component name, a location name which specifies a position to be mounted on the PWB and a pin name of the component.

Referring to FIG. 3, the circuit model 17 includes a plurality of discrete components of RES 41-RES 46 which become the reduction target components, the first power line 47, the second power line 48 and a plurality of LSIs (LSI 51-59). The circuit model 17 is a circuit diagram which is generated by connecting each component based on wiring connection information included in the PKG net list 11.

There five kinds of component names for describing this exemplary embodiment, and they are "first type LSI", "second type LSI", "third type LSI", "fourth type LSI" and "RES". According to this exemplary embodiment, "D0", "D1", "D2", "D3", "M0", "M1", "C0", "C1", "B", "R1", "R2", "R3", "R4", "R5" and "R6" are used as each location name. The type of bus which is connecting from the component whose location name is "C0" to each of the components whose location name is "D0" or "D1" is a 10 bit bus. Similarly, the type of bus which is connecting from the component whose location name is "C1" to each of the components whose location name is "D2" or "D3" is a 10 bit bus. The type of bus which is connecting from the component whose location name is "C0" to the component whose location name is "M0" is a differential pair bus. Similarly, the type of bus which is connecting from the component whose location name is "C1" to the component whose location name is "M1" is a differential pair bus.

Referring to FIG. 3, RES 41 is a component having component name "RES" and location name "R1" and it includes two pins of pin P1 and pin P2. RES 42 is a component having component name "RES" and location name "R2" and it includes two pins of pin P1 and pin P2. RES 43 is a component having component name "RES" and location name "R3" and it includes two pins of pin P1 and pin P2. RES 44 is a component having component name "RES" and location name "R4" and it includes two pins of pin P1 and pin P2. RES 45 is a component having component name "RES" and location name "R5" and it includes two pins of pin P1 and pin P2.

RES 46 is a component having component name "RES" and location name "R6" and it includes two pins of pin P1 and pin P2.

LSI 51 is a component having component name "first type LSI" and location name "D0", and it includes ten pins each pin has pin name of D[0], D[1], D[2], D[3], D[4], D[5], D[6], D[7], D[8] or D[9] respectively. LSI 52 is a component having component name "first type LSI" and location name "D1", and it includes ten pins each pin has pin name of D[0], D[1], D[2], D[3], D[4], D[5], D[6], D[7], D[8] or D[9] respectively. LSI 53 is a component having component name "second type LSI" and location name "M0", and it includes two pins of pin P3 and pin P4. LSI 54 is a component having component name "third type LSI" and location name "C0", and it includes ten pins each pin has pin name of D[0], D[1], D[2], D[3], D[4], D[5], D[6], D[7], D[8] or D[9] respectively and two more pins of pin CLP and pin CLN. LSI 55 is a component having component name "first type LSI" and location name "D2", and it includes ten pins each pin has pin name of D[0], D[1], D[2], D[3], D[4], D[5], D[6], D[7], D[8] or D[9] respectively. LSI 56 is a component having component name "first type LSI" and location name "D3", and it includes ten pins each pin has pin name of D[0], D[1], D[2], D[3], D[4], D[5], D[6], D[7], D[8] or D[9] respectively. LSI 57 is a component having component name "second type LSI" and location name "M1", and it includes two pins of pin P3 and pin P4. LSI 58 is a component having component name "third type LSI" and location name "C1", and it includes ten pins each pin has pin name of D[0], D[1], D[2], D[3], D[4], D[5], D[6], D[7], D[8] or D[9] respectively and two more pins of pin CLP and pin CLN. LSI 59 is a component having component name "fourth type LSI" and location name "B". Further, the pin name of "D [0-9]" shown in FIGS. 3, 9 and 10 expresses ten pins together for each pin having a pin name of D[0], D[1], D[2], D[3], D[4], D[5], D[6], D[7], D[8] or D[9].

Figure 4:
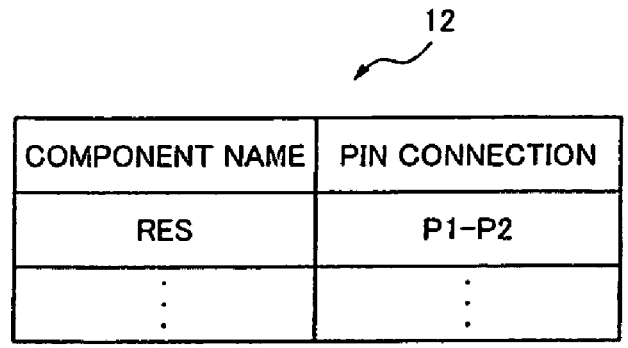
FIG. 4 is a table exemplifying a part of contents of the reduction components library 12.
Figure 5:
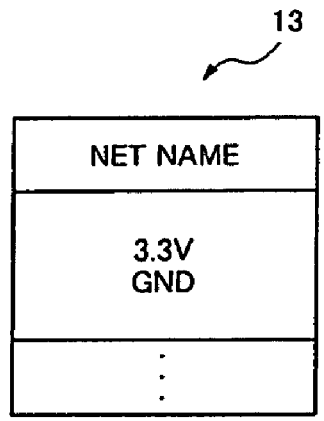
FIG. 5 is a table exemplifying a part of contents of the power and ground net library 13.
Figure 6:
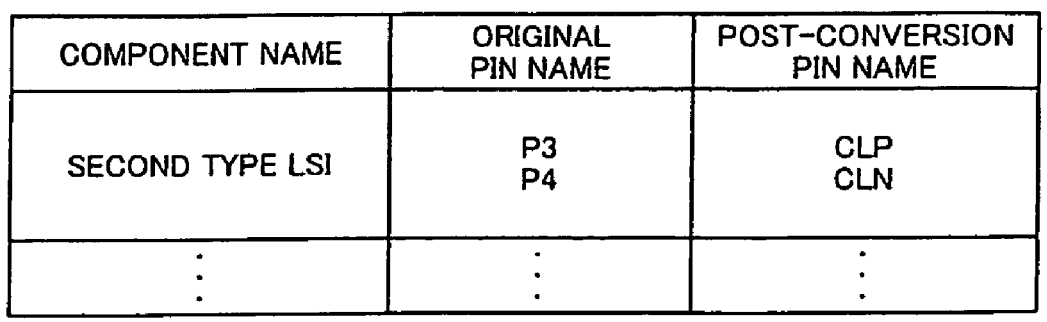
FIG. 6 is a table exemplifying a part of contents of the pin assignment library 14.

FIG. 4 is a table exemplifying a part of contents of the reduction components library 12. The reduction components library 12 defines that component name of the reduction target component is "RES", and pin P1 is connected to pin P2 as a connection relationship at a time of reduction being performed. FIG. 5 is a table exemplifying a part of contents of the power and ground net library 13. The power and ground net library 13 defines a net of 3.3V and GND. FIG. 6 is a table exemplifying a part of contents of the pin assignment library 14. The pin assignment library 14 defines that component name of the conversion target component is "second type LSI" and also defines correspondence of the pin name before conversion and the pin name after conversion.

FIG. 7 is a table exemplifying a part of contents of the connection rule 15. The connection rule 15 includes a row for rules 61 and a row for functions 62. The connection rule 15 also includes each of columns, a column for rule name 63, a column for start point conditions 64 and a column for end point conditions 65. The column for end point conditions 65 includes a column for first end point conditions 65a and a column for second end point conditions 65b.

In this example, the connection rule 15 defines a first rule, a second rule, function "f(x)" and function "g(x, y)". The first rule designates the variable "x1" to the start point location name and the variable "x2" to the start point pin name, and uses the function "f(x1)" for the first end point location name and the function "f(x2)" for the first end point pin name. Similarly, the second rule uses the variable "x1" and the variable "x2" for the start point side, and the function "f(x)" and the function "g(x, y)" for the end point side.

Figure 8A:
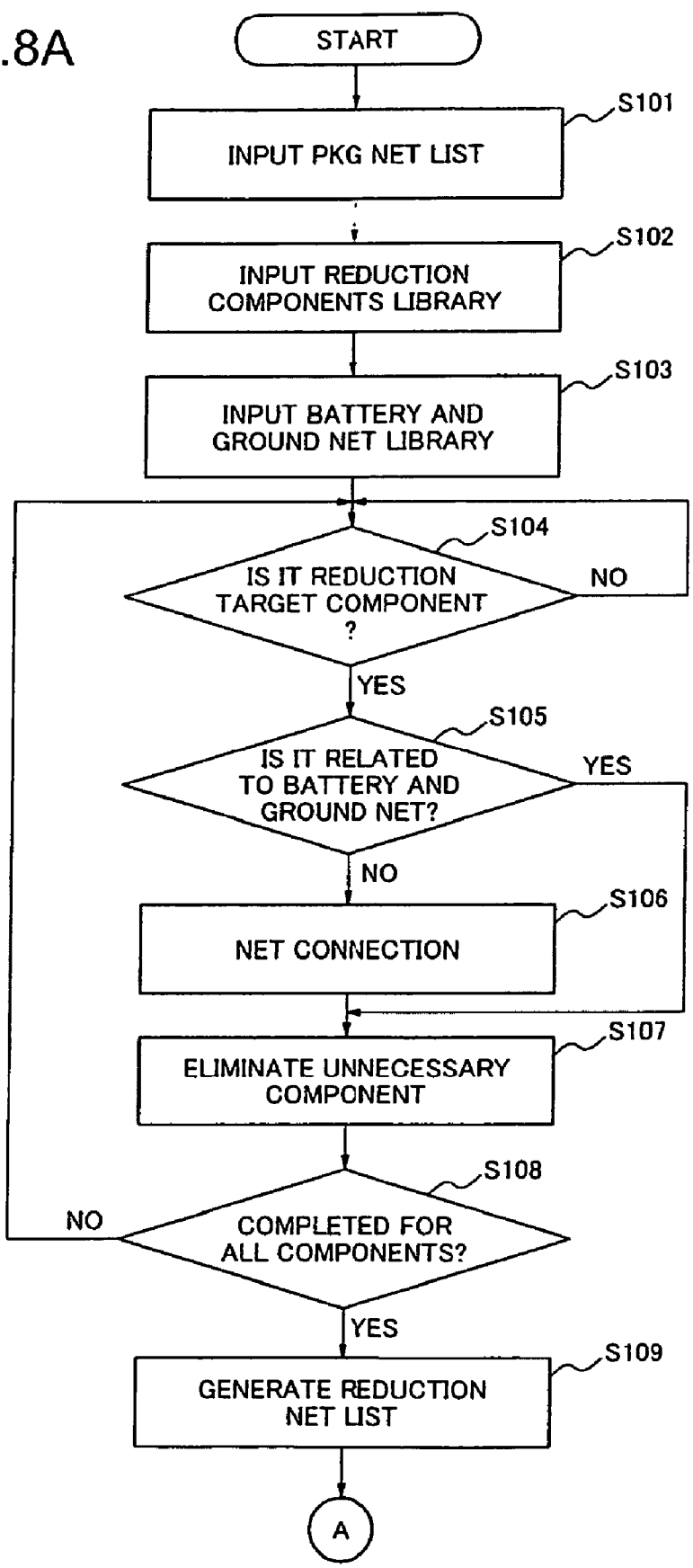
FIG. 8A is a flowchart showing a first stage of operation of this exemplary embodiment.
Figure 8B:
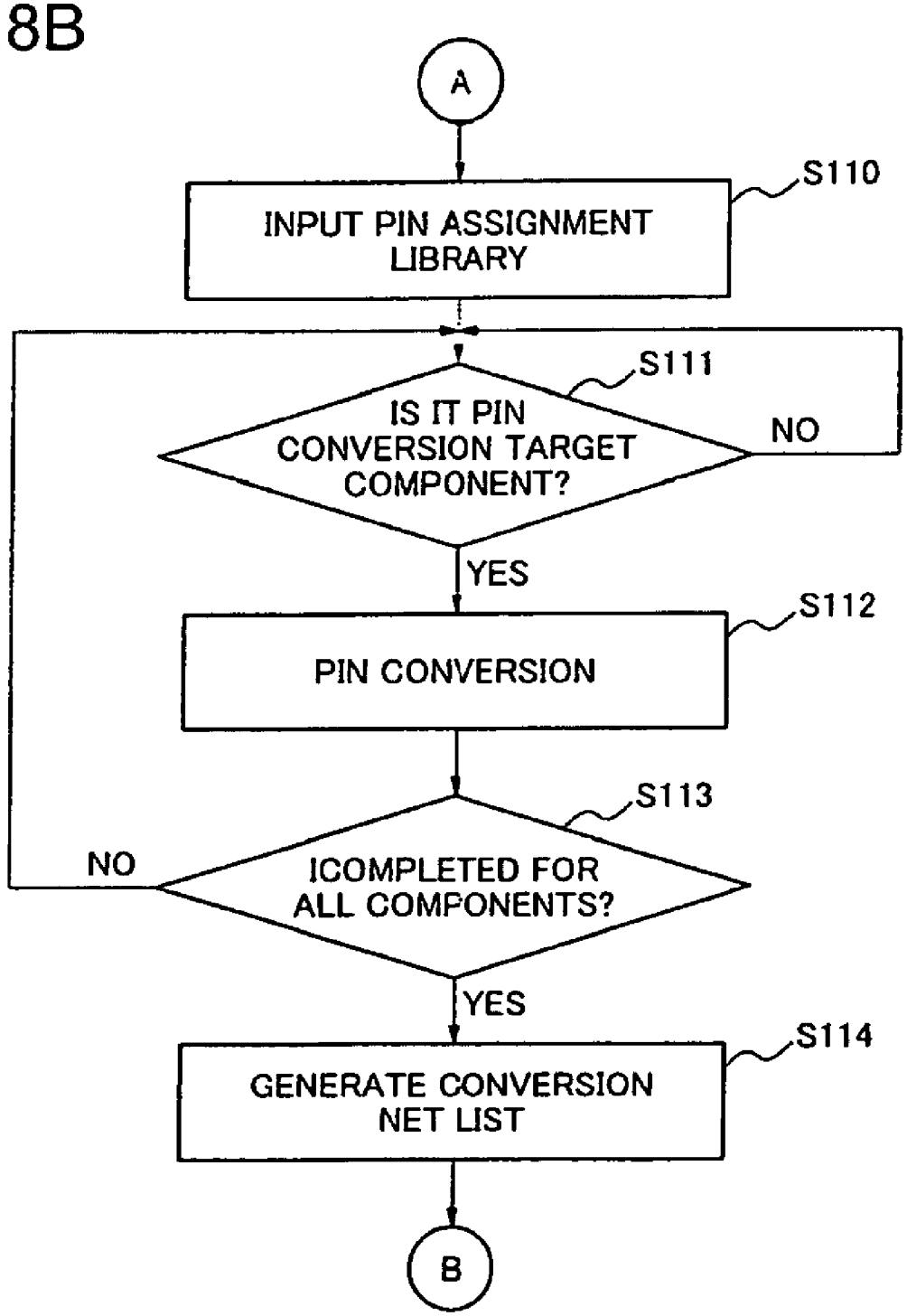
FIG. 8B is a flowchart showing a second stage of operation of this exemplary embodiment.
Figure 8C:
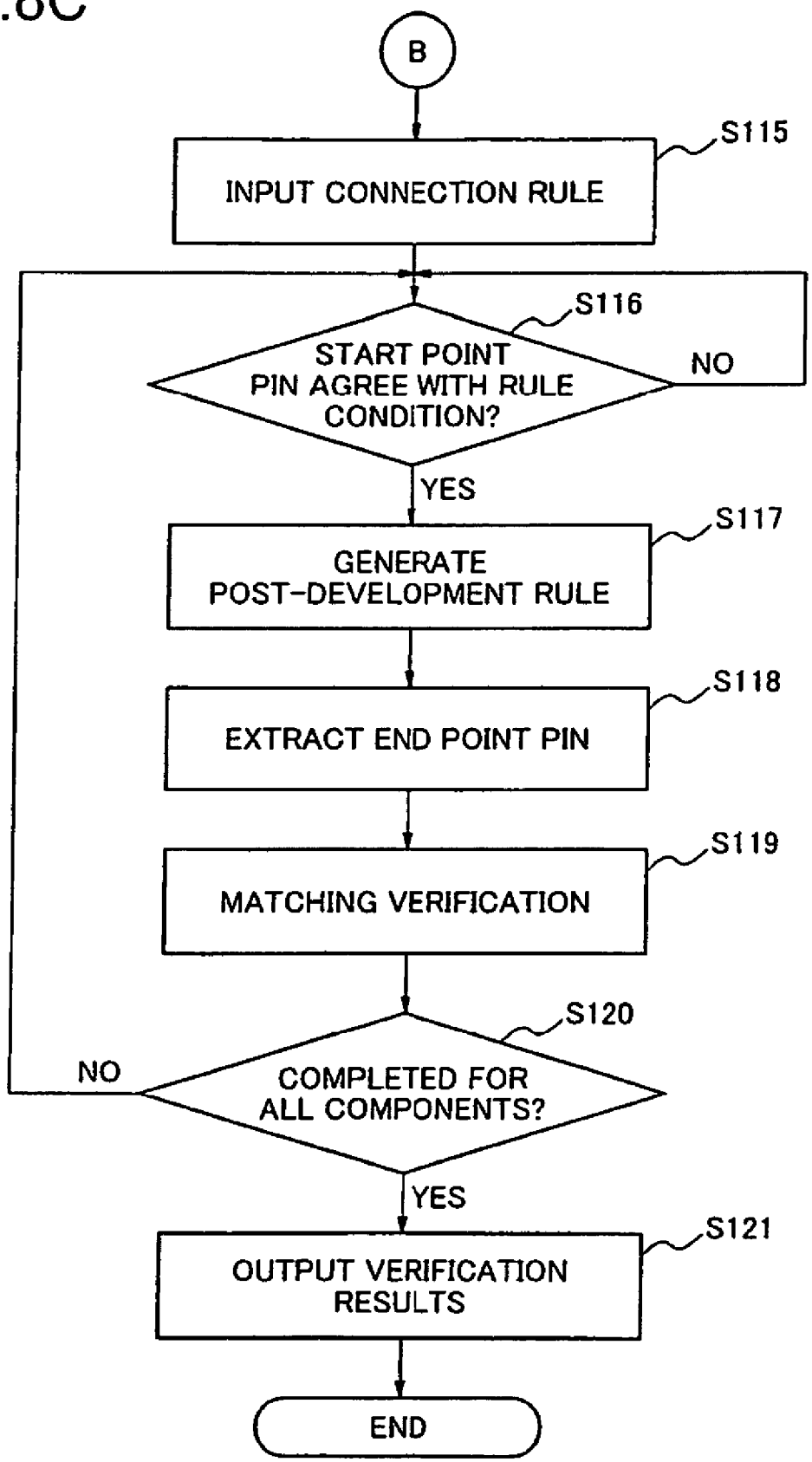
FIG. 8C is a flowchart showing a third stage of operation of this exemplary embodiment.

FIG. 8A, FIG. 8B and FIG. 8C are flowcharts which indicate operation of this exemplary embodiment by three stages.

The Operation of this exemplary embodiment is realized by the CPU 5 of the information processing unit 2 which activates the verification tool 16 and performs processing operation by following procedures indicated by the verification tool 16.

FIG. 8A is a flowchart showing a first stage of operation of this exemplary embodiment.

In Step S101, the net list reduction part 21 of the verification tool 16 reads the PKG net list 11 and generates the circuit model 17 based on information contained in the PKG net list 11. In Step S102, the net list reduction part 21 reads the reduction components library 12, and after that, reads the power and ground net library 13 in Step S103.

In Step S104, the net list reduction part 21 specifies each component included in the PKG net list 11 successively, and confirms whether it is a component defined by the reduction components library 12 (determination of the reduction target component). As a result of the determination of the reduction target component, if the specified component is included in the reduction components library 12, processing will advance to Step S105. As a result of the determination of the reduction target component, if the specified component is not included in the reduction components library 12, processing returns and another new component is specified to confirm whether it is a component defined by the reduction component library 12.

Specifically, in processing of Steps S101-S104, the net list reduction part 21 checks all components contained in the PKG net list 11 successively based on information obtained from the PKG net list 11, the reduction components library 12 and the power and ground net library 13, and specifies the reduction target component. The reduction target component is an object component for the reduction processing. Referring to FIG. 3, in the circuit model 17, there are components (LSI 51-59) each having the location name of "D0", "D1", "D2", "D3", "M0", "M1", "C0" "C1" or "B", and the component name of "first type LSI", "second type LSI" "third type LSI" or "fourth type LSL". As shown in FIG. 4, these component names are not included in the reduction components library 12. Therefore, these components (LSI 51-59) are not the reduction target components, and the reduction processing is not performed to these components. The components (RES 41-46) each having the location name of "R1", "R2", "R3", "R4", "R5" or "R6" are also included in the circuit model 17, and each of these components has the component name of "RES". The component name of "RES" is included in the reduction components library 12, and these components (RES 41-46) are specified as the reduction target components. Accordingly, the reduction processing will be performed to these components (RES 41-46) because these components are regarded as unnecessary components for verification.

In Step S105, the net list reduction part 21 refers to the power and ground net library 13 and determines whether there is a pin, among pins of the specified reduction target component, which is included in a power and ground net defined in the power and ground net library 13. As a result of the determination, if there is such a pin which is included in the power and ground net defined in the power and ground net library 13, all pins involved in the connection relationship with this pin, which is included in the power and ground net, are made open state, and processing will advance to Step S107. As a result of the determination, if there is not such a pin included in the power and ground net defined in the power and ground net library 13, the net in the connection relationship with this pin, which is not included in the power and ground net, is directly connected and this original pin is made open state in Step S106, and processing will advance to Step S107.

In Step S107, when all pins of the reduction target component become open state, the net list reduction part 21 eliminates the reduction target component from the circuit model 17.

In Step S108, the net list reduction part 21 performs determination processing whether the reduction processing to all components included in the PKG net list 11 has completed. As a result of the determination processing, when the reduction processing to all components has not yet completed, processing returns to Step S104. As a result of the determination processing, when the reduction processing to all components has completed, processing will advance to Step S109. In Step S109, the net list reduction part 21 generates the reduction net list 31 which includes the net list defining each wiring connection of the circuit diagram after reduction processing has been performed to each connection relating to the reduction target components among all components used in the verification target PWB.

Referring to FIG. 3, the component (RES 41) having the component name of "RES" and the location name of "R1" and the component (RES 44) having the component name of "RES" and the location name of "R4" include a net in which one of pins (i.e., pin P2) is connected to a power supply (first power supply line 47 or second power supply line 48) and the power supply of 3.3V is defined in the power and ground net library 13 of FIG. 5. Therefore, the net list reduction part 21 makes the pin P2 of both components (RES 41 and RES 44) open state, and also makes the pin P1 of the same components (RES 41 and RES 44) open state because the pin P1 has the connection relationship with the pin P2. Then, each of components (RES 42, 43, 45 and 46) having the location name of "R2", "R3", "R5" and "R6" includes a net in which none of pin is connected to a power supply. Therefore, with respect to these components (RES 42, 43, 45 and 46), the pin P1 and the pin P2 are connected each other in accordance with corresponding information on the reduction components library 12 of FIG. 4 "P1-P2", and each pin of P1 and P2 is made open state.

After that, in Step S107, the component having all pins being open state is eliminated. In other words, the components RES 41-46 of the location name "R1", "R2", "R3", "R4", "R5" and "R6" are eliminated. When it is confirmed in Step S108 that processing for all components has been completed, the net list reduction part 21 performs the processing of Step S109, in which the reduction net list 31 is generated, and the net list reduction part 21 takes over processing to the pin conversion part 22.

Figure 9:
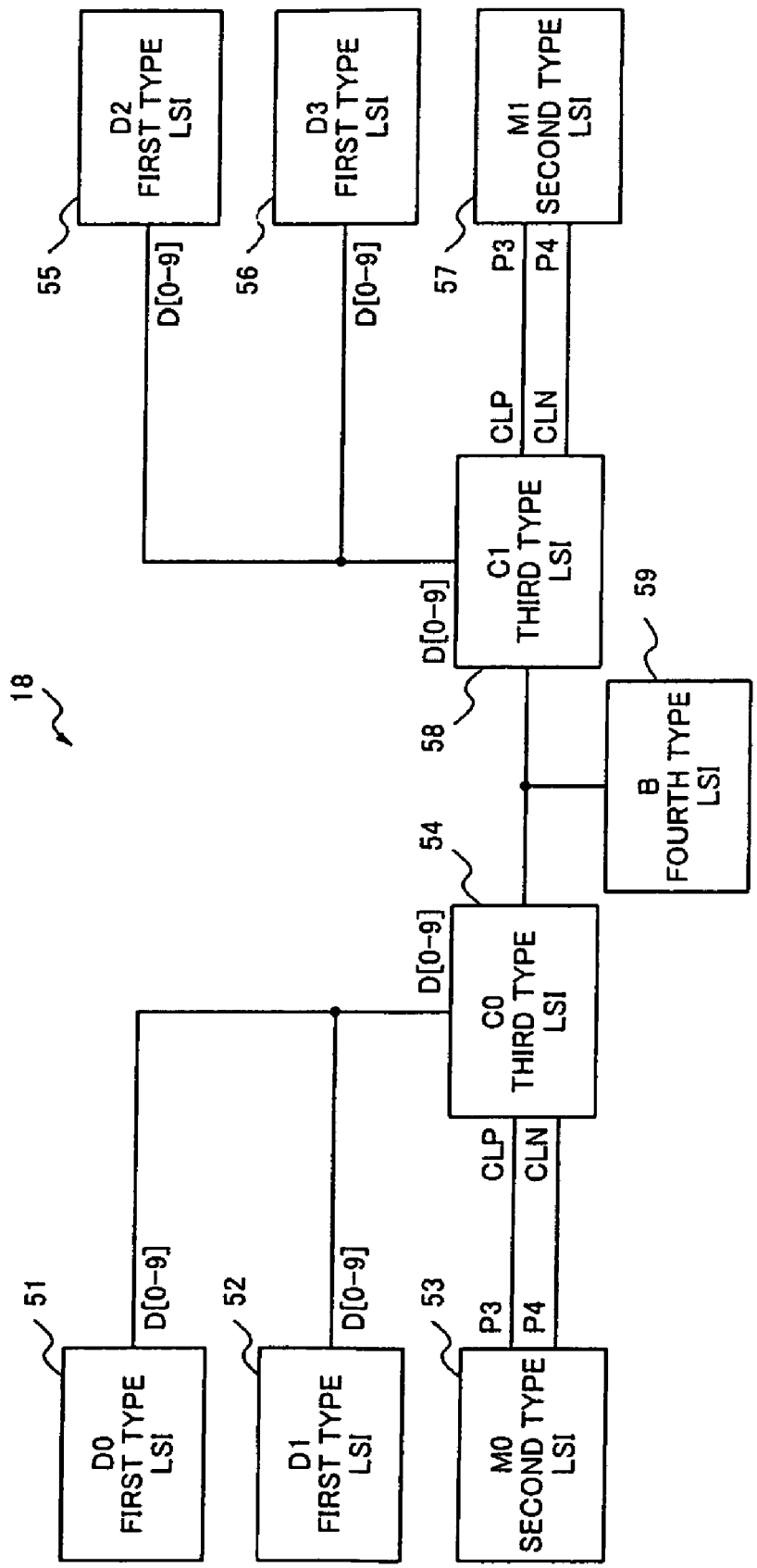
FIG. 9 is a circuit diagram exemplifying the post-reduction circuit model 18 generated based on the reduction net list 31.

FIG. 9 is a circuit diagram showing the post-reduction circuit model 18 generated based on the reduction net list 31. When comparing the circuit model 17 of FIG. 3 with the post-reduction circuit model 18 of FIG. 9, it is understood that the pin P1 and the P2 of respective components RES 42, 43, 45 and 46 having the location name "R2", "R3", "R5" and "R6" are connected and the components RES 41-46 having the location name "R1", "R2", "R3", "R4", "R5" and "R6" are eliminated. That is, the net list reduction part 21 generates the reduction net list 31 by connecting wiring between pins of the unnecessary component defined in the reduction components library 12, disconnecting wiring at a pin relating to the power and ground net and removing the unnecessary components.

FIG. 8B is a flowchart showing a second stage of operation of this exemplary embodiment.

In Step S110, the pin conversion part 22 reads the pin assignment library 14. In Step S111, the pin conversion part 22 specifies each pin of the components included in the reduction net list 31, and determines whether the specified pin is a pin of the pin conversion target component defined in the pin assignment library 14. As a result of the determination, if the specified pin is the pin of the pin conversion target component, processing will advance to Step S112. As a result of the determination, if the specified pin is not the pin of the pin conversion target component, processing returns to Step S111. In other words, another new pin is specified and it repeats determining whether the pin is the pin of the pin conversion target component with reference to the definition on the pin assignment library 14. In this way, the pin conversion part 22 carries out sequential processing to all pins of the components included in the reduction net list 31.

When it is found that the specified pin is the pin of the conversion target component (hereinafter called as a conversion target pin), the pin conversion part 22 rewrites a net list relating to the conversion target pin in Step S112 by using the converted pin name defined in the pin assignment library 14. In Step S113, the pin conversion part 22 performs determination processing whether all pins of all components included in the reduction net list 31 has been specified for finding the conversion target pin, and pin conversion for all conversion target pins has completed. As a result of the determination, when the pin conversion for all conversion target pins has completed, processing will advance to Step S114. As a result of the determination, when the pin conversion for all conversion target pins has not yet completed, processing returns to Step S111 and the pin conversion processing for another new pin of the component in the reduction net list is performed. When the above-mentioned processing has completed for all pins concerned, in Step S114, the pin conversion part 22 generates the conversion net list 32.

Thus, the pin conversion part 22 checks all pins of all components included in the reduction net list 31 successively with reference to the pin assignment library 14 and performs the pin name conversion processing.

As shown in FIG. 9, in the post-reduction circuit model 18, there are two components (LSI 51 and LSI 57) having the location name "M0 or M1". They have a component name of "second type LSI", and this component name is defined in the pin assignment library 14 in FIG. 6. Therefore, these components (LSI 51 and LSI 57) are the conversion target components. In this case, the pin conversion part 22 converts the pin name of "P3" into "CLP" according to the definition in the pin assignment library 14. Similarly, the pin conversion part 22 converts the pin name of "P4" into "CLN". When the pin conversion part 22 finishes the pin conversion processing for all pins of the conversion target components included in the reduction net list 31, it generates the conversion net list 32.

Figure 10:
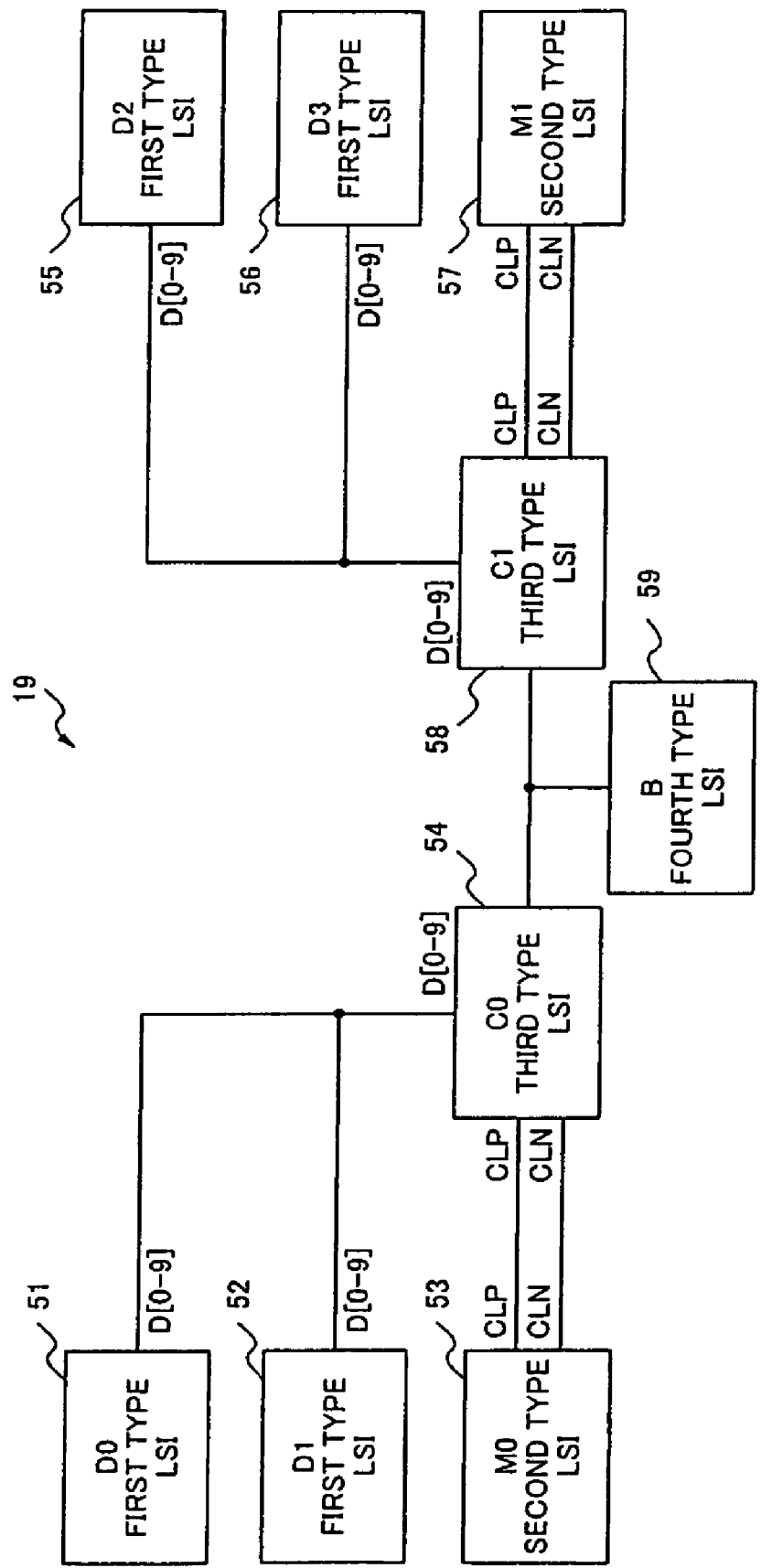
FIG. 10 is a circuit diagram exemplifying the post-conversion circuit model 19 generated based on the conversion net list 32.

FIG. 10 is a circuit diagram exemplifying the post-conversion circuit model 19 generated based on the conversion net list 32. When comparing the post-conversion circuit model 19 of FIG. 10 with the post-reduction circuit model 18 of FIG. 9, it is understood that the pin name of LSI 53 is converted from "P3" to "CLP", and converted from "P4" to "CL". It is also understood that the pin name of LSI 57 is converted from "P3" to "CLP", and converted from "P4" to "CLN".

FIG. 8C is a flowchart showing a third stage of the operation of this exemplary embodiment. In the third stage operation, the post-development rule 33 and the verification result 34 are generated by using the rule expanding part 23 and the net list and rule matching verification part 24.

In Step S115, the rule expanding part 23 reads the connection rule 15. In Step S116, the rule expanding part 23 specifies a pin of the component included in the conversion net list 32 successively, and searches for a rule in which the start point pin conditions defined in this rule agree with the specified pin conditions with referring to contents of the connection rule 15. When the rule, whose start point pin conditions agree with the specified pin conditions, is found in the contents of the connection rule 15, the rule expanding part 23 advances its processing to Step S117. If it is not found such a rule in the contents of the connection rule 15, the rule expanding part 23 returns its processing to Step S116 and gives up this pin as a target for verification. Then, the rule expanding part 23 specifies another new pin of the component included in the conversion net list 32 and performs the similar determination repeatedly. Here, in the search operation as above performed by the rule expanding part 23, it requires for the determination that all identities of "start point component name", "start point location name" and "start point pin name" should be the same between the rule and the specified pin. Accordingly, it may perform processing in advance for excluding those components in which "start point component name" or "start point location name" is apparently different from the defined condition of the rule.

When the rule in which the start point pin conditions defined in this rule agree with the specified pin conditions is found in the connection rule 15, the rule expanding part 23 extracts and determines values of the variable parts defined at the corresponding start point pin conditions in this rule and evaluates the function for defining the end point conditions by using the determined values. The formulas of the function are defined in the connection rule 15. And, as variables to be used by the function, the determined values from the variable parts defined at the corresponding start point pin conditions are substituted to the function. The rule expanding part 23 determines conditions of the end point which is corresponding to the specified start point by embodying variables and the function in this way and generates the post-development rule 33.

Referring to FIG. 10, there are pins corresponding to components (LSI 51, 52, 55, 56, 53, 57 and 59) having location name of "D0", "D1", "D2", "D3", "M0", "M1" and "B" in the post-conversion circuit model 19. When judgment for each of those pins is performed, the rule expanding part 23 judges that each of those pins of such components do not satisfy the condition "Cx1" of the start point location name defined by any of rules in the connection rule 15, and excludes those pins corresponding to components (LSI 51, 52, 55, 56, 53, 57 and 59) from the verification target. When judgment for each pin has been completed, the rule expanding part 23 specifies the next pin and repeats processing of judgment.

When the pin CLP of the component (LSI 54) having location name of "C0" is specified, the rule expanding part 23 judges that this pin name "CLP" satisfies the condition "CLx2" of the start point pin name defined by the first rule in the connection rule 15. This component (LSI 54) also satisfies the conditions "Cx1" of the start point location name and "third type LSI" of the start point component name defined by the first rule in the connection rule 15. Therefore, the rule expanding part 23 judges that the conditions relating to the specified pin (CLP) of the component (LSI 54) agree with the definition of the connection rule 15. The rule expanding part 23 determines the corresponding end point conditions by calculating the function defined for the end point with using the variable values extracted and determined from the start point location name and the start point pin name defined in the first rule of the connection rule 15.

Referring to FIG. 7, because the condition of the start point location name of the first rule is "Cx1" and the start point location name of the specified component is "C0", the value of variable "x1" is calculated with reference to correspondence defined by the first rule, i.e., "Cx1=C0", then, "x1=0" is obtained. Also, because the condition of the start point pin name of the first rule is "CLx2" and the start point pin name of the specified pin is "CLP", the value of variable "x2" is calculated with reference to correspondence defined by the first rule, i.e., "CLx2=CLP", then, "x2=P" is obtained. Like this manner, the variables "x1" and "x2" in the first rule are determined as "0" and "P" respectively.

Then, from the function "f(x)=x" defined as the function 62 in the connection rule 15, "f(x1)=x1", and "f(x2)=x2" are obtained.

When look at the end point conditions, the first end point location name of the first end point condition 65a is defined as "Mf(x1)". Therefore, "f(x1)=x1=0" is substituted to "Mf(x1)", and "M0" is obtained as the first end point location name.

The first end point pin name of the first end point condition 65a is defined as "CLf(x2)". Therefore, "f(x2)=x2=P" is substituted to "CLf(x2)", and "CLP" is obtained as the first end point pin name. The rule expanding part 23 outputs the end point conditions calculated as above and the corresponding start point conditions by using the actual attribute information (i.e., the component name, location name of the component and pin name of the component) of the specified pin to the post-development rule 33.

Next, the rule expanding part 23 specifies the pin CLN of the component (LSI 54) having location name of "C0". This pin name "CLN" satisfies the condition "CLx2" of the start point pin name defined by the first rule in the connection rule 15. This component (LSI 54) also satisfies the conditions "Cx1" of the location name and "third type LSI" of the start point component name defined by the first rule. The rule expanding part 23 calculates the end point conditions by using the variable values extracted and determined from the start point location name and the start point pin name defined in the first rule similarly as above, and generates the post-development rule 33. The rule expanding part 23 performs similar processing to the pin CLP of the component (LSI 58) having location name of "C1". Also, the rule expanding part 23 performs similar processing to the pin CLN of the component (LSI 58) having location name of "C1". In this way, the rule expanding part 23 generates the post-development rule 33 according to the first rule.

Further, the rule expanding part 23 specifies the pin D [0] of the component (LSI 54) having location name of "C0". This pin name "D[0]" satisfies the condition "D [x2]" of the start point pin name defined by the second rule in the connection rule 15 of FIG. 7. This component (LSI 54) also satisfies the conditions "all components" (i.e., any component is available) of the start point component name and "Cx1" of the start point location name defined by the second rule in the connection rule 15. Therefore, the rule expanding part 23 judges that the conditions relating to the specified pin agree with the definition of the second rule of the connection rule 15. The rule expanding part 23 calculates the end point conditions by using the variable values extracted and determined from the start point location name and the start point pin name defined in the second rule and the function 62 similarly as above.

In this case, because the condition of the start point location name of the second rule is "Cx1" and the start point location name of the specified part is "C0", the value of variable "x1" is calculated with reference to correspondence defined by the second rule, i.e., "Cx1=C0", then, "x1=0" is obtained. Also, because the condition of the start point pin name of the second rule is "D[x2]" and the start point pin name is "D[0]", the value of variable "x2" is calculated with reference to correspondence defined by the second rule, i.e., "D[x2]=D[0]", then, "x2=0" is obtained. Like this manner, the variables "x1" and "x2" in the second rule are determined as "0" and "0" respectively.

Then, from the function "f(x)=x" defined as the function 62 in the connection rule 15, "f(x2) x2=0" is obtained, and also from the function "g(x, y)=2x+y" defined as the function 62, "g (x1, y)=2(x1)+y=y" is obtained.

Thereby, it is obtained that the component name of the first end point is "all type LSI", the location name of the first end point is "Dg(x1,0)=D(2x0+0)=D0" and the pin name of the first end point is "D[f(x2)]=D[0]".

And also, it is obtained that the component name of the second end point is "all type LSI", the location name of the second end point is "Dg(x1,1)=D(2x0+1)=D1" and the pin name of the second end point is "D[f(x2)]=D[0]".

FIG. 11 is a table exemplifying a part of contents of the post-development rule 33 generated by the rule expanding part 23. The post-development rule 33 has items of the rule name 63, the start point conditions 64 and the end point conditions 65 (the first end point conditions 65a and the second end point conditions 65b). As shown in FIG. 11, the post-development rule 33 correlates the end point conditions 65 obtained by the above-mentioned operation to the start point conditions 64.

Back to FIG. 8C, in Step S118, a list of end point pins connected to each corresponding start point pin is extracted with referring to connection relationship indicated in the conversion net list 32. In Step S119, it is verified whether each extracted connection relationship between the start point pin and the end point pin agree with the connection relationship defined by the post-development rule 33. In Step S120, it determines whether processing steps from S116 to S119 (confirmation of coincidence between the start pin conditions and the connection rule definition, and verification of the post-development rule obtained by rule expansion of the connection rule) have been completed for all pins. As a result of the determination, if processing steps from S116 to S119 have been completed for all pins, it advances processing to Step S121. As a result of the determination, if processing steps from S116 to S119 have not been completed for all pins, it returns processing to Step S116.

At the time when above processing steps from S116 to S119 for all pins have been completed, the verification result 34 which includes above verification results for all pins is generated and outputted in Step S121.

FIG. 12 is a table exemplifying a part of contents of the verification result 34. The net list and rule matching verification part 24 traces all connections from each start point pin with referring to the conversion net list 32. For example, when a connection from the pin CLP of the component (LSI 54) having location name of "C0" is traced with referring to the conversion net list 32, it reaches the pin CLP of the component (LSI 53) having location name of "M0" and its component name of "second type LSI".

Next, the net list and rule matching verification part 24 confirms the end point conditions which are corresponding to the start point pin having the same conditions as above with referring to the post-development rule 33. At this time, with respect to the start point pin CLP of the component having location name of "C0", as the first end point conditions, it is found that the end point pin CLP of the component having location name of "M0" and its component name of "second type LSI" in accordance with the conditions set in the post-development rule 33. Therefore, it is confirmed that a tracing result based on the conversion net list 32 and the conditions set to the post-development connection rule 33 are identical.

Like this manner, when the conditions of the end point obtained by tracing the conversion net list 32 is identical to the contents of the post-development rule 33, a mark of "agreed" is recorded in the result column 66 of the verification result 34 shown in FIG. 12 as a result of verification.

In this way, rule development of the end point and its verification after development are also performed for each start point pin D[0]-D[9] of the components having location name of "C0" and "C1", and the result is outputted to the verification result 34. When above processing for all pins has completed, the verification result 34 including all verification results is generated.

As it has been described above, in the PWB design, the present invention can easily verify whether the net list is a logically correct connection. In most cases, a regular formation seems to be used for each connection of LSI mounted on the PWB. Therefore, the present invention pays attention to this point, and connection relationships and regularity of such regular formation is considered in rule description for connection rule. Thereby, according to the present invention, it becomes possible to verify the wide range of connections by preparing not many descriptions for connection rule and possible to store such descriptions of connection rule by using not many resources.

By using a plurality of PKG net lists, the present invention can be applied to a verification system which performs connection verification for connections provided between plural printed wiring boards. It is also possible for the present invention that a resistor and a capacitor connected with a power line or a ground line are excluded from the reduction target components. Further, the present invention can be applied to another verification system which performs electrical verification and connective verification for resistors and capacitors connected with a power line or a ground line with preparing an intermediate net list in which information of electrical characteristics is added, as well as performing connection verification as above.

While this invention has been particularly shown and described with reference to exemplary embodiments thereof, the invention is not limited to those specific embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. A circuit verification apparatus for verifying a net list of wiring connections designed for a printed wiring board (PWB) comprising:
   a net list reduction art which generates a reduction net list, in which unnecessary components and unnecessary connections for verification are eliminated from connection relationships for all components used in the PWB, via referring to a reduction components library which defines the unnecessary components and unnecessary connections and a power and ground net library which defines a net to become a power and ground net, by connecting wiring between pins of the unnecessary component defined in the reduction components library, disconnecting wiring at a pin relating to the power and ground net and removing the unnecessary component;
   a pin conversion part which converts a specified pin name according to predetermined conversion information among pin names included in the reduction net list, and generates a conversion net list in which pin names corresponding to the predetermined conversion information have been converted;

a connection rule which includes each connection rule for defining an expected wiring connection in a verification target PWB and defines conditions of a start point and an end point of the expected wiring connection;

a rule expanding part which generates a post-development rule, in which the start point conditions and the corresponding end point conditions are stored, based on data read from the connection rule and the conversion net list by searching a pin whose conditions agree with the start point conditions defined in the connection rule, specifying the pin as a start point pin, developing the end point conditions based on the connection rule via using attribute information of the start point pin and correlating the developed end point conditions to the start point conditions in the post-development rule; and a net list and rule matching verification part which verifies a matching state of the start point and corresponding end point for each connection via referring to the reduction net list, the conversion net list, and the post-development rule, and outputs a verification result, wherein, the rule expanding part searches all pins successively used in the conversion net list for specifying the start point pin to determine the end point conditions.

2. The circuit verification apparatus according to claim 1, wherein the connection rule designates variables for defining the start point conditions, and designates functions for defining the end point conditions; and wherein the rule expanding part determines value of each variable of the start point conditions according to specific conditions of the specified start point pin, and determines the end point conditions by calculating the defined functions by substituting the value derived from the start point conditions.

3. The circuit verification apparatus according to claim 2, wherein each of the start point conditions and the end point conditions include a component name, a location name where the component is mounted on the PWB and a pin name of the component.

4. The circuit verification apparatus according to claim 3, wherein the rule expanding part searches for a pin of component which has the component name, the location name and the pin name being agreed with the conditions of the start point defined by the connection rule, and determines the value of each variable of the start point conditions defined in the connection rule by comparing each condition between actual name and the variable, and determines actual name of corresponding conditions of the end point by substituting the value derived from the actual name of the start point conditions into the functions.

5. The circuit verification apparatus according to claim 4, wherein the post-development rule includes actual name for each of the start point conditions and the corresponding end point conditions.

6. The circuit verification apparatus according to claim 5, wherein the net list and rule matching verification part extracts the actual names relating to the start point and the end point of each connection by tracing the conversion net list, and verifies whether the same actual names are set in each of the start point conditions and the end point conditions with respect to the same connection in the post-development rule.

7. A method of circuit verification for verifying a net list of wiring connections designed for a printed wiring board (PWB) comprising the steps of:

a generating a reduction net list step performed by a net list reduction part implemented at least in part by a processing device which performs a generating step for generating a reduction net list, in which unnecessary components and unnecessary connections for verification are eliminated from connection relationships for all components used in the PWB, via referring to a reduction components library which defines the unnecessary components and unnecessary connections and a power and ground net library which defines a net to become a power and ground net, by connecting wiring between pins of the unnecessary component defined in the reduction components library, disconnecting wiring at a pin relating to the power and round net and removing the unnecessary component;

a pin conversion step performed by a pin conversion part which performs a converting step for converting a specified pin name according to predetermined conversion information among pin names included in the reduction net list, and a generating step for generating a conversion net list in which pin names corresponding to the predetermined conversion information have been converted;

a rule expanding step performed by a rule expanding part implemented at least in part by the processing device which performs a reading step for reading data from a connection rule, which includes each connection rule for defining an expected wiring connection in a verification target PWB and defines conditions of a start point and an end point of the expected wiring connection, and the conversion net list, a searching step for searching a pin whose conditions agree with the start point conditions defined in the connection rule, a specifying step for specifying the pin as a start point pin, a developing step for developing the end point conditions based on the connection with by using attribute information of the start point pin, and a generating step for generating a post-development rule, in which the start point conditions and the corresponding end point conditions are stored, by correlating the developed end point conditions to the start point conditions in the post-development rule; and a verifying step performed by a net list and rule matching verification part implemented at least in part by the processing device which performs a verifying step for verifying a matching state of the start point and a corresponding end point for each connection by referring to the reduction net list and the post-development rule, and an outputting step for outputting a verification result.

8. The method of circuit verification according to claim 7, wherein the connection rule designates variables for defining the start point conditions, and designates functions for defining the end point conditions; and wherein the rule expanding step includes, a condition determining step for determining value of each variable of the start point conditions according to specific conditions of the specified pin start point pin, and determining the end point conditions by calculating the defined functions by substituting the value derived from the start point conditions.

9. The method of circuit verification according to claim 8, wherein each of the start point conditions and the end point conditions include a component name, a location name where the component is mounted on the PWB and a pin name of the component.

10. The method of circuit verification according to claim 9, wherein the condition determining step includes,
   a searching step for searching for a pin of component which has the component name, the location name and the pin name being agreed with the conditions of the start point defined by the connection rule;
   a start point condition determining step for determining the value of each variable of the start point conditions defined in the connection rule by comparing each condition between actual name and the variable; and
   a end point condition determining step for determining actual name of corresponding conditions of the end point by substituting the value derived from the actual name of the start point conditions into the functions.

11. The method of circuit verification according to claim 10, wherein the post-development rule includes actual name for each of the start point conditions and the corresponding end point conditions.

12. The method of circuit verification according to claim 11, wherein the verifying step includes,
   an extracting step for extracting the actual names relating to the start point and the end point of each connection by tracing the conversion net list; and
   a determination step for determining whether the same actual names extracted by the extracting step are set in each of the start point conditions and the end point conditions with respect to the same connection in the post-development rule.

13. A non-transitory computer readable medium having a circuit verification program stored thereon to verify a net list of wiring connections designed for a printed wiring board (PWB), for causing a processing device to execute:
   a generating a reduction net list process including
      a generating step for generating a reduction net list, in which unnecessary components and unnecessary connections for verification are eliminated from connection relationships for all components used in the PWB, via referring to a reduction components library which defines the unnecessary components and the unnecessary connections and a power and ground net library which defines a net to become a power and ground net, by connecting wiring between pins of the unnecessary component defined in the reduction components library, disconnecting wiring at a pin relating to the power and ground net, and removing the unnecessary component;
   a pin conversion process including
      a converting step for converting a specified pin name according to predetermined conversion information among pin names included in the reduction net list, and
      a generating step for generating a conversion net list in which pin names corresponding to the predetermined conversion information have been converted;
   a rule expanding process including
      a reading step for reading data from a connection rule, which includes each connection rule for defining an expected wiring connection in a verification target PWB and defines conditions of a start point and an end point of the expected wiring connection, and the conversion net list,
      a searching step for searching a pin whose conditions agree with the start point conditions defined in the connection rule,
      a specifying step for specifying the pin as a start point pin,
      a developing step for developing the end point conditions based on the connection rule by using attribute information of the start point pin, and
      a generating step for generating a post-development rule, in which the start point conditions and the corresponding end point conditions are stored, by correlating the developed end point conditions to the start point conditions in the post-development rule; and
   a verifying process including
      a verifying step for verifying a matching state of the start point and corresponding end point for each connection by referring to the reduction net list and the post-development rule, and
      an outputting step for outputting a verification result.

14. The computer readable medium having a circuit verification program stored thereon according to claim 13, wherein the connection rule designates
   variables for defining the start point conditions, and designates functions for defining the end point conditions; and
   wherein the rule expanding process includes,
      a condition determining step for determining value of each variable of the start point conditions according to specific conditions of the specified start point pin, and determining the end point conditions by calculating the defined functions by substituting the value derived from the start point conditions.

15. The computer readable medium having a circuit verification program stored thereon according to claim 14, wherein each of the start point conditions and the end point conditions include a component name, a location name where the component is mounted on the PWB and a pin name of the component.

16. The computer readable medium having a circuit verification program stored thereon according to claim 15, wherein the condition determining step includes,
   a searching step for searching for a pin of component which has the component name, the location name and the pin name being agreed with the conditions of the start point defined by the connection rule;
   a start point condition determining step for determining the value of each variable of the start point conditions defined in the rule by comparing each condition between actual name and the variable; and
   a end point condition determining step for determining actual name of corresponding conditions of the end point by substituting the value derived from the actual name of the start point conditions into the functions.

17. The computer readable medium having a circuit verification program stored thereon according to claim 16, wherein the post-development rule includes actual name for each of the start point conditions and the corresponding end point conditions.

18. The computer readable medium having a circuit verification program stored thereon according to claim 17, wherein the verifying step includes,
   a extracting step for extracting the actual names relating to the start point and the end point of each connection by tracing the conversion net list; and
   a determination step for determining whether the same actual names extracted by the extracting step are set in each of the start point conditions and the end point conditions with respect to the same connection in the post-development rule.

* * * * *